United States Patent
Wenham et al.

(10) Patent No.: US 9,613,814 B2
(45) Date of Patent: Apr. 4, 2017

(54) METAL ADHESION

(75) Inventors: Alison Maree Wenham, Cronulla (AU); Martin Andrew Green, Bronte (AU); Stuart Ross Wenham, Cronulla (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 360 days.

(21) Appl. No.: 13/254,631

(22) PCT Filed: Feb. 24, 2010

(86) PCT No.: PCT/AU2010/000215
§ 371 (c)(1),
(2), (4) Date: Feb. 7, 2012

(87) PCT Pub. No.: WO2010/099564
PCT Pub. Date: Sep. 10, 2010

(65) Prior Publication Data
US 2012/0132270 A1    May 31, 2012

(30) Foreign Application Priority Data
Mar. 3, 2009 (AU) ................... 2009900923

(51) Int. Cl.
| | | |
|---|---|---|
| H01L 31/00 | (2006.01) | |
| H01L 21/268 | (2006.01) | |
| H01L 31/0224 | (2006.01) | |

(52) U.S. Cl.
CPC .... *H01L 21/268* (2013.01); *H01L 31/022425* (2013.01); *Y02E 10/50* (2013.01)

(58) Field of Classification Search
USPC .................................. 136/243–293
See application file for complete search history.

(56) References Cited

U.S. PATENT DOCUMENTS

| | | | | |
|---|---|---|---|---|
| 4,352,948 A | * | 10/1982 | Kaplow et al. | ........... 136/249 |
| 5,081,049 A | * | 1/1992 | Green et al. | ............... 438/71 |
| 5,882,435 A | | 3/1999 | Holdermann | |

(Continued)

FOREIGN PATENT DOCUMENTS

| | | | | |
|---|---|---|---|---|
| CN | 101336465 A | | 12/2008 | |
| DE | 3919693 | | 12/1989 | |
| WO | WO 2007/059551 | * | 5/2007 | ........... H01L 21/04 |

OTHER PUBLICATIONS

McCann et al., "Angled Buried Contacts: A front contacting scheme for high efficient cells with low shading losses", 20th European Photovoltaic Solar Cell Conference, Jun. 6-10, 2005, pp. 737-740.*

(Continued)

*Primary Examiner* — Thanh-Truc Trinh
(74) *Attorney, Agent, or Firm* — Thomas | Horstemeyer, LLP (57) ABSTRACT

A solar cell has a metal contact formed to electrically contact a surface of semiconductor material forming a photovoltaic junction. The solar cell includes a surface region or regions of heavily doped material and the contact comprises a contact metallisation formed over the heavily doped regions to make contact thereto. Surface keying features are located in the semiconductor material into which the metallisation extends to assist in attachment of the metallisation to the semiconductor material.

12 Claims, 6 Drawing Sheets

(56) References Cited

U.S. PATENT DOCUMENTS

| | | | |
|---|---|---|---|
| 6,162,658 A * | 12/2000 | Green et al. .................... 438/57 |
| 6,429,037 B1 * | 8/2002 | Wenham ........... H01L 31/02242 |
| | | | 438/558 |
| 2002/0068385 A1 | 6/2002 | Ma et al. |
| 2004/0200522 A1 * | 10/2004 | Fukawa et al. ............... 136/259 |
| 2005/0268963 A1 * | 12/2005 | Jordan ................. B23K 26/367 |
| | | | 136/256 |
| 2009/0007962 A1 | 1/2009 | Wenham et al. |

OTHER PUBLICATIONS

English translation abstract of CN101336465A (published Dec. 31, 2008).
CN Office Action dated Apr. 2, 2013.
English translation of CN Office Action dated Apr. 2, 2013.
The International Search Report and Written Opinion dated May 6, 2010.
European Search Report dated Nov. 4, 2014; European Patent Office, Munich, Germany; 7 pages for application 10748222.6.

\* cited by examiner

METAL ADHESION

CROSS-REFERENCE TO RELATED APPLICATION

This application is the 35 U.S.C. §371 national stage of PCT Application No. PCT/AU10/000036, international filing date 15 Jan. 2010, which claims priority to Australian Application No. 2009900187, filed on 16 Jan. 2009 and Australian Application No. 2009900171, filed on 16 Jan. 2009.

INTRODUCTION

The present invention relates generally to the field of photovoltaics and in particular an improved method of creating contacts is disclosed.

BACKGROUND

A common criticism of plated metal contacts for photovoltaic devices is the poor adhesion to the silicon material. This problem is exacerbated when thermal cycling occurs due to the thermal expansion mismatch between the silicon and the metal and also when low metal/silicon interface area is used which is common in high performance cells due to the improved electrical performance. There is consequently often a trade-off between electrical performance and durability. The laser doped solar cell faces the same challenges [S. R. Wenham, M. A. Green "*A Self-Aligning Method for Forming a Selective Emitter and Metallization in a Solar Cell*", International Patent No. PCT/AU/1999/00522, July, 1999], with the best electrical performance achieved when the laser doped region is flat and smooth which also corresponds to the lowest subsequent metal/silicon interface area after plating and therefore the poorest adhesion.

Figures 8, 8A, 8B:
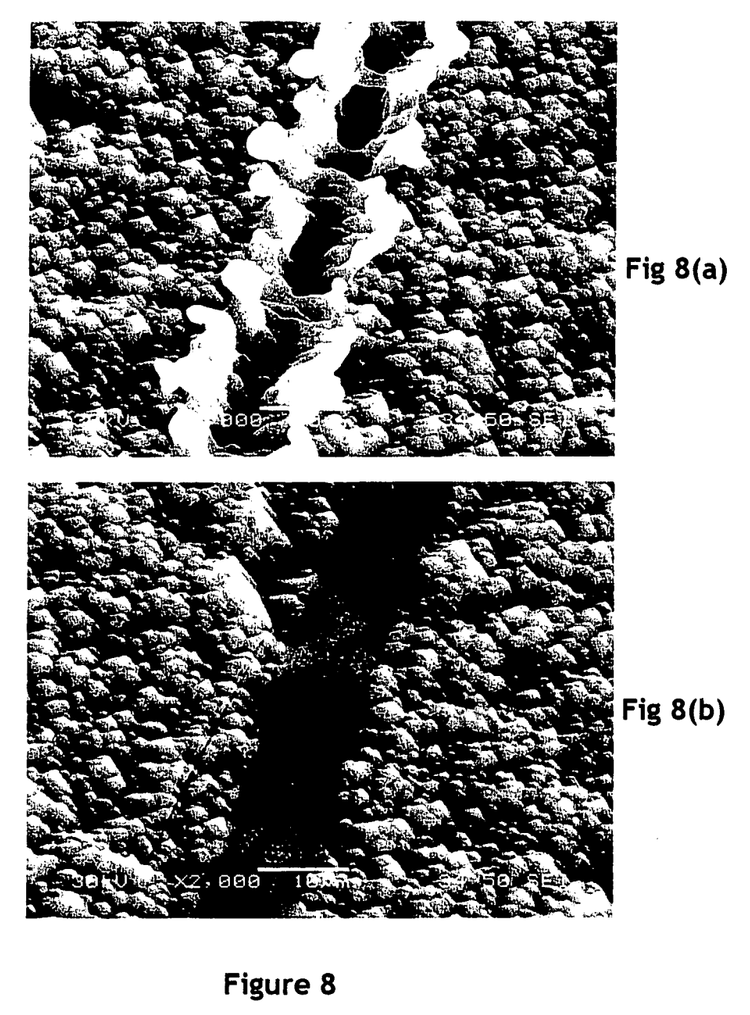
Figure 9:
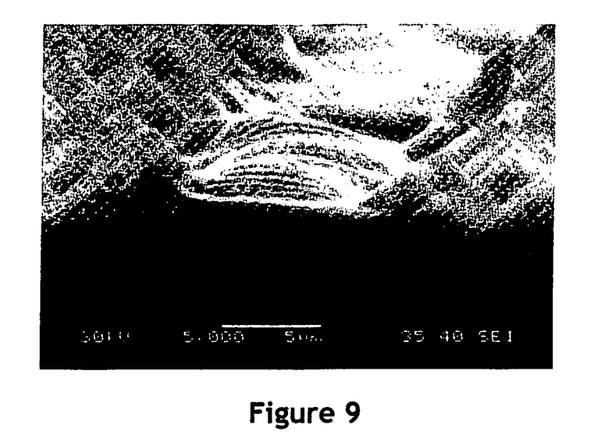
FIG. 9 shows another photograph of a contact groove similar to that of FIG. 8b the relatively smooth surface following laser doping that gives best electrical performance.
Figure 10:
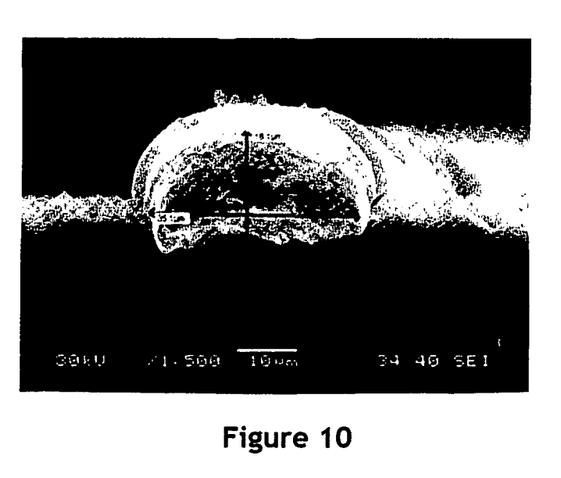
FIG. 10 shows a photograph of a contact after metallisation.

The laser doping process is most commonly carried out using a Q-switched 532 nm NdYAG laser. The laser beam is scanned across the surface of typically a silicon nitride (ARC) coated silicon wafer in the presence of a dopant source so that sufficient energy is delivered to the silicon to melt it and allow the dopants to diffuse into the molten silicon. This process simultaneously damages or removes the silicon nitride layer therefore exposing the recrystallised doped silicon surface so that subsequent metal plating, often Ni/Cu/Ag or Ni/Cu/Sn, can be effected. Even when a textured or roughened silicon surface is used, the laser melting/doping process, if done for sufficient duration to allow proper diffusion/mixing of the dopants, leads to the formation of a relatively smooth surface as shown in FIGS. 8(*b*) and 9. Subsequent metal adhesion to such surfaces, as shown in FIG. 10, is therefore a challenge.

SUMMARY

A solar cell is provided having metal contact formed to electrically contact a surface of semiconductor material forming a photovoltaic junction, the solar cell comprising a surface region or regions of heavily doped material and contact metallisation formed over the heavily doped regions to make contact thereto, and surface keying features located in the semiconductor material into which the metallisation extends to assist in attachment of the metallisation to the semiconductor material.

The contact and the surface keying features are preferably provided on a front or light receiving surface of semiconductor material.

The solar cell may include at least one hole having an undercut region resulting in an overhang under which the metallisation extends. The hole may be substantially perpendicular to the surface of the semiconductor material and the undercut region forms a ledge around a part of a periphery of an opening of the hole at the surface of the semiconductor material. The hole may also extend at an angle to the perpendicular with respect to the surface of the semiconductor material such that the hole undercuts the surface. Adjacent holes or alternate holes may extend in different directions relative to the perpendicular to further enhance the locking function.

A method of fabricating a solar cell is also provided the solar cell having a metal contact formed to electrically contact a surface of semiconductor material forming a photovoltaic junction the contact being formed by:
a) providing a dopant source on or adjacent to the surface of the semiconductor material;
b) heating the semiconductor surface region by laser at a first laser intensity to damage and remove any surface dielectric layers and diffuse dopant from the dopant source into the heated region to provide a region of heavily doped material where contacts are to be formed;
c) intermittently heating points on the semiconductor material surface by laser, within a region in which contacts will be made, to damage and remove any surface dielectric layers and form surface keying features into the surface of the semiconductor material at the heated points; and
d) plating contact metallisation over the heavily doped regions to make contact thereto, the plating extending into the intermittent surface keying features to assist in attachment of the metallisation to the semiconductor material.

In this method the contact and the surface keying features are preferably provided on a front or light receiving surface of semiconductor material.

In one method the keying features are formed by higher energy laser pulses than the average laser pulse used for laser melting/doping so as to deliberately ablate some silicon thereby roughening the silicon surface.

In another method, a continuous wave laser operation is used for the laser melting/doping and periodic Q-switched laser pulses or groups of pulses are used to create holes or grooves or surface roughness in specific locations to "pin" the metal to the silicon in these locations.

In yet another method, higher energy levels are used while laser doping to create increased turbulence within the molten silicon being doped to increase the surface roughness when frozen (but without necessarily ablating silicon).

In particular the above keying methods may be used at the ends of each laser doped line where each metal finger terminates to thereby increase adhesion at these points where the metal is most likely to detach from the laser doped silicon. However these keying methods will preferably be used periodically along each laser doped line in addition to at the ends so as to provide isolated locations of good metal adhesion without significantly increasing the overall metal/silicon interface area.

In one advantageous method, the repetition rate and power of the higher energy level pulses are adjusted to create overhanging regions or ledges of silicon at the periphery of a hole such that subsequently plated metal beneath such overhangs becomes a barb which keys or "locks" the metal into the sculpted silicon surface.

In a further improvement, following the formation of isolated holes or grooves while performing laser doping of the silicon, a lower energy laser heating step is used to melt the surrounding regions of silicon so as to create overhanging regions or ledges of silicon such that subsequently plated metal beneath such overhangs becomes a barb which keys or "locks" the metal into the sculpted silicon surface.

BRIEF DESCRIPTION OF THE DRAWINGS

Embodiments of the invention will now be described, by way of example with reference to the accompanying drawings in which;

FIG. 8 shows in FIG. 8(a) a photograph of a contact groove before metallisation showing significantly increased surface area, which results from the use of additional energy per pulse and which causes some ablation of the silicon, while in FIG. 8b a photograph of another contact groove shows the relatively smooth surface that gives best electrical performance following laser doping without the use of additional energy;

DETAILED DESCRIPTION OF METHODS OF FORMING METAL CONTACTS

Figure 1:
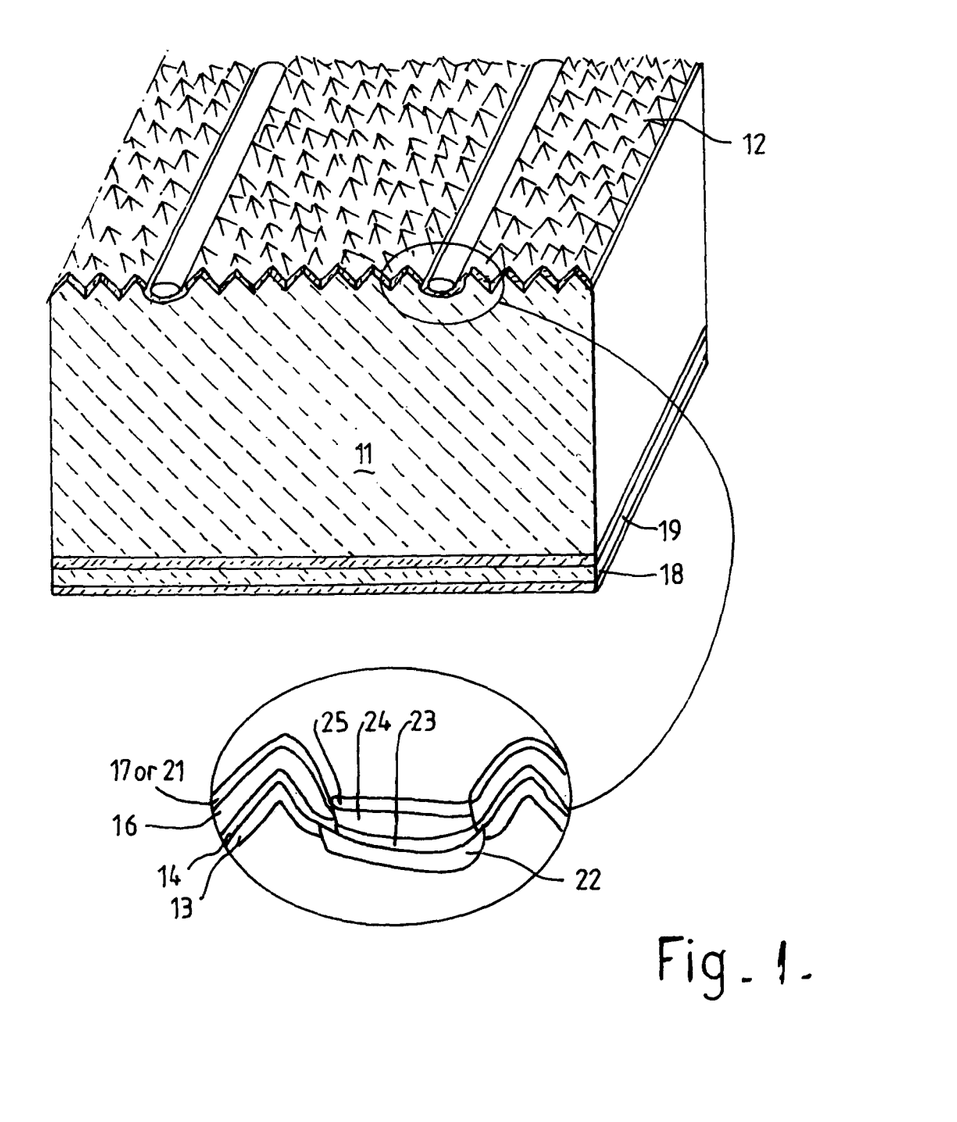
FIG. 1 illustrates a prior art solar cell to which the metallisation keying method of the present invention may be applied.

By way of example, and with reference to FIG. 1, a suitable fabrication sequence for the formation of a silicon solar cell is as follows:
1. Isotropic texturing 12 of the front (or light receiving) surface of the p-type wafer 11;
2. front surface diffusion of n-type dopant 13;
3. edge junction isolation/psg removal;
4. ARC deposition on the front surface by PECVD;
   a. 100 angstroms of hydrogen rich silicon nitride specifically for surface passivation 14;
   c. 600 angstroms of silicon nitride 16 of refractive index 2.0-2.1;
   d. dopant containing layer 17;
5. screen-print rear (non-light receiving) surface with aluminium for rear contact 18;
6. fire rear surface to sinter rear contacts 18 and form back surface field 19 by formation of aluminium/silicon alloy and liquid phase epitaxy;
7. laser doping of silicon in localised regions to form heavily doped (n+) regions 22 for formation of self-aligned front surface metal contacts;
8. Plating a layer of Nickel 23 over the laser doped n+ regions 22 for the front surface contacts;
9. sintering of Nickel 23;
10. Plating of layers of Copper 24 and Tin 25 (or Silver) over the Nickel 23;

The above processing sequence produces the high performance solar cell structure of FIG. 1 with a selective emitter that provides heavy doping of the silicon directly beneath the metal contacts.

The proposed contact formation method departs from the sequence described above by the addition of periodic higher energy pulses or sequences of pulses which are delivered by the laser to deliberately roughen and/or ablate some of the silicon in those specific locations. Good results have been achieved when only single (or very small number) of very short (typically less than 0.1 microseconds) high energy pulses are used at a time so that the laser beam will have only typically moved 1 micron or less (when travelling at typically 10 m/s) during the hole formation by the high energy pulse. This allows subsequent lower energy pulses to increase the laser doping of the walls of the hole formed by the high energy pulse, therefore minimising any degradation in electrical performance that might otherwise occur through the use of such holes. In addition, such holes can typically be located a long way apart (at least triple and preferably at least on average ten times) relative to the hole diameter so that the total surface area of laser doped silicon is not increased overall by more than 20% compared to if the high energy pulses were not used. This prevents significant degradation in electrical performance compared to the case where surface keying is not used. FIGS. 8(b) and 9 show the relatively smooth surface following laser doping that gives best electrical performance while the structure of FIG. 8(a) with significantly increased surface area, results from the use of additional energy per pulse that causes some ablation of the silicon.

Importantly, following plating, the holes provide anchor points, greatly enhancing the overall adhesion strength of the metal to the silicon. In particular, such holes are beneficially used at or near the ends of the metal lines which in general are the weakest points where peeling of the metal initiates. Higher densities of holes or even elongated holes formed by several sequential higher energy pulses are beneficially used in these regions to "pin" the metal to the silicon.

The higher energy pulses can be generated by either increasing the laser power for such pulses or alternatively keeping the laser power constant and slightly increasing the time delay preceding the formation of such higher energy pulses so that more energy is stored in the laser crystal or laser diode by the time the pulse is initiated. Both approaches lead to increased energy in the following laser pulse. The energy of such pulses is preferably set so that a hole of typically 5-10 microns depth is formed, although good devices have been made with hole depths as high as 80 microns and with depths approaching zero.

A potential further enhancement of the strength of the metal adhesion to the silicon can be achieved by using several sequential higher energy pulses so as to produce a short groove say 20-100 microns long. The lower energy pulses for laser doping can be used in the vicinity of the ends of such a groove to provide partial coverage by the resolidified silicon, therefore producing a "fishhook" type of effect by allowing subsequent plating to be buried beneath the silicon at the end or ends of the groove, therefore greatly increasing the strength of the metal adhesion.

Conventional Q-switched lasers don't provide the capability to produce controlled higher energy pulses periodically interspersed amongst the more plentiful lower energy pulses used for the laser doping pulses. Special electronics for controlling the Q-switch however can be simply incorporated into most machines to give this capability. Some machines can be modified in an improvised fashion by allowing programmable frequency changes for the Q-switching during laser processing/scanning which can be crudely used to control the energy of the pulses and therefore be used to perform one form of this metallisation method.

A variation of the present metallisation method involves using a separate laser head or even type of laser to independently form the holes which are then subsequently passed over by the laser that does the silicon melting for the laser doping process. Another variation is to superimpose two laser beams, one with higher energy pulses operating at much lower frequency to produce periodic holes while the other laser with lower energy pulses operates at much higher frequency as required for the laser melting and doping of the silicon.

Another variation is to use a laser on continuous wave operation without any Q-switching to do the laser melting and doping of the silicon, but have the capability to swap to Q-switched operation to allow the generation of the higher energy pulse or pulses that ablate some silicon to produce a hole or holes in desired locations. In this type of operation, there is no "loss" introduced into the optical cavity of the laser so that the laser beam is continuous and able to continuously melt and dope the silicon. Each time a hole in the silicon is required, loss is introduced into the optical cavity of the laser to prevent stimulated emission and therefore allow energy to be stored in the laser crystal or laser diode for typically 0.1 to 100 microseconds, such that when the loss is eliminated, the stored energy is dissipated as a high energy laser pulse able to ablate silicon. Another variation of this mode of operation is where the laser energy is simply varied sufficiently to create turbulence within the molten silicon at desired locations during the doping process without necessarily ablating any or much silicon. In this scenario, a rougher surface topology can again be achieved as the molten silicon is frozen into the geometry created by the higher level of turbulence. The laser energy in this case can be controlled to produce the surface topology for the silicon that contributes most to improving metal adhesion.

Figure 2:
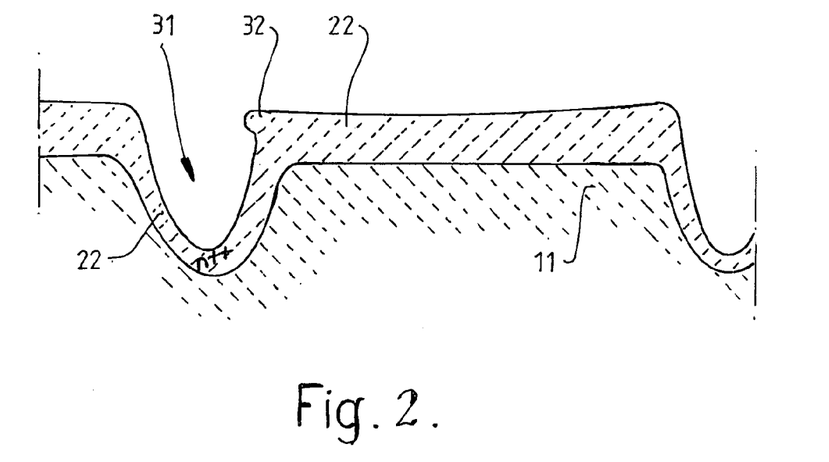
FIG. 2 schematically illustrates a cross-section along the length of a laser doped line showing the occurrence of periodic holes formed in accordance with one proposed method to anchor the metal contact in those locations.
Figure 3:
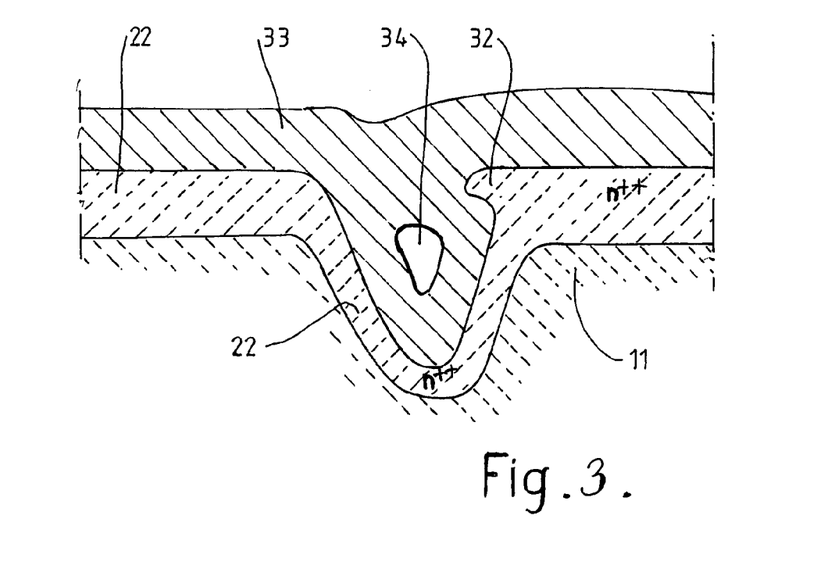
FIG. 3 schematically illustrates the typical structure resulting following the plating of the structure in FIG. 2 with metal.
Figure 4:
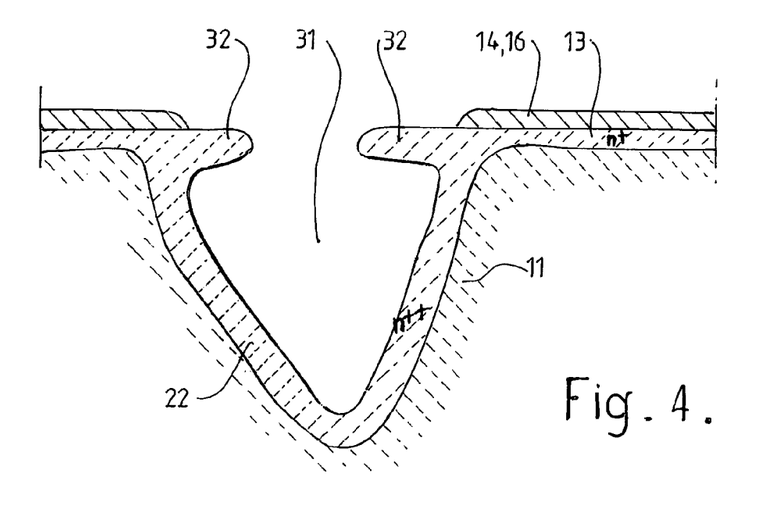
FIG. 4 schematically illustrates an overhang or ledges which occur on the trailing edge of each hole and to some extent on the sides of the holes when the frequency of the laser pulses for doing the laser melting and doping is high enough to cause a large amount of overlap between adjacent pulses.
Figure 5:
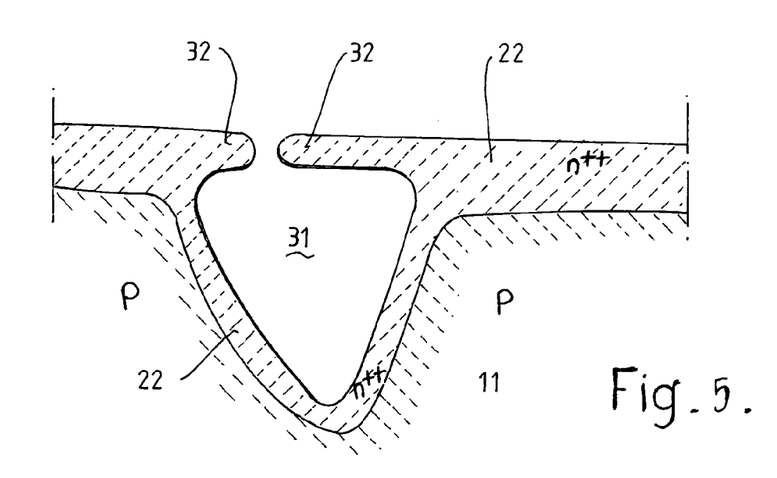
FIG. 5 schematically illustrates the result of pulse overlap above about 80%, where it becomes possible for the hole to be almost fully covered.

FIG. 2 shows the cross-section along the length of a laser doped line showing the occurrence of periodic holes 31 formed in accordance with one proposed method to anchor a metal contact in those locations. FIG. 3 shows the typical structure resulting following the plating of the structure in FIG. 2 with metal 33. On occasions it is possible to get voids 34 forming within the plated metal region 33 within the holes 31 as the metal closes over before the hole 31 is fully plated. The overhang or ledges 32 occur on the trailing edge of each hole and to some extent on the sides of the holes 31 as shown in FIG. 4 when the frequency of the laser pulses for doing the laser melting and doping is high enough to cause a large amount of overlap between adjacent pulses. Once the amount of overlap reached above about 80% it becomes possible for the hole to be almost fully covered or even fully covered with some overhang developing on the leading edge as well, as shown in FIG. 5, although when this occurs many of the benefits are lost due to the difficulty in getting good metal plating within the buried holes.

Figure 6:
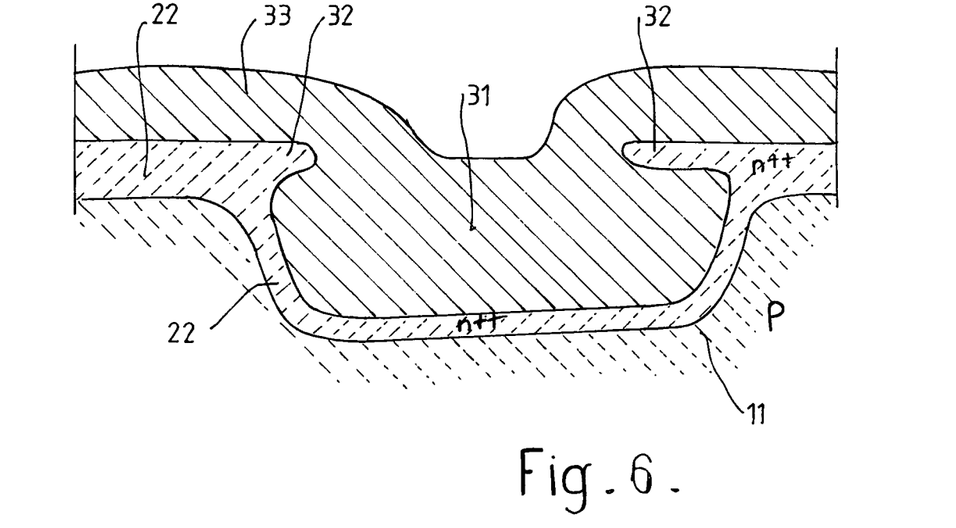
FIG. 6 schematically illustrates a cross-section along the length of a laser doped line showing the occurrence of a short groove formed by a sequential group of higher energy pulses.

FIG. 6 shows the cross-section along the length of a laser doped line showing the occurrence of a short groove formed by a sequential group of higher energy pulses, and exhibiting moderate overhangs to more substantially anchor the metal contact in those locations.

Figure 7:
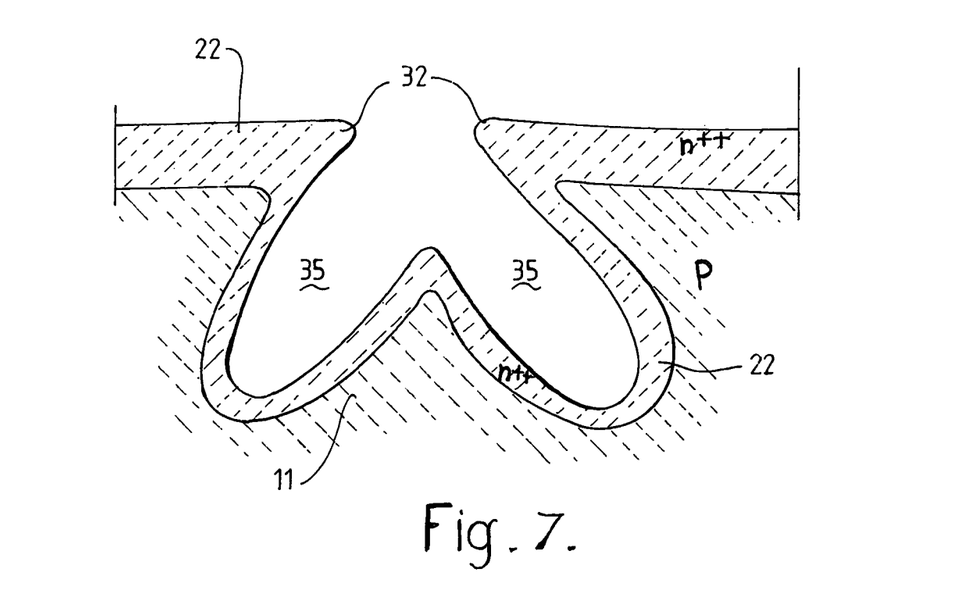
FIG. 7 schematically illustrates holes in the silicon, which are formed at an angle to the surface so that some or all are no longer perpendicular to the surface.

The general principle of the proposed metallisation methods is to increase the metal/silicon interface area in specific strategic locations such as at the end of metal lines so as to increase the overall metal adhesion strength by reducing the tendency for the metal to commence peeling or detaching from the silicon surface. In a more advantageous form of the proposed method the silicon is structured/processed in such a way that the resulting geometry of the plated metal (that conforms to the shape of the silicon) keys or locks it into the silicon material such as by forming a underlying barbs or projections that engage undercut portions of the groove in the silicon. This principle of "locking the metal into the silicon" is deemed to apply whenever the silicon is sculpted in such a way so that the subsequent metal plated contact or the silicon must be distorted by changing in shape for the metal to be able to be separated from the silicon. FIG. 2 showed an example of this where the ledge or overhang in the silicon acted to "lock" the metal into its location beneath the ledge so that the metal could not be separated from the silicon without the copper or the silicon ledge being distorted and changed in shape. Another example of this would be where the holes in the silicon were formed at an angle to the top surface so that some or all were no longer perpendicular to the top surface such as shown in FIG. 7 where adjacent holes are formed so as to deliberately not be parallel to each other so as to "lock" the subsequently plated metal into the silicon.

While the rear contacts are screen printed in the example described above, the method of forming plated contacts used for the front contacts in this example could equally be used to form rear contacts with the use of a suitable dopant for the step of heavily doping the surface.

As shall be appreciated by someone skilled in the art, such sculpting of the silicon surface can be achieved in a range of ways. The use of a laser to ablate the silicon has been given as an example although chemical etching, mechanical abrasion, plasma etching or various other techniques such as a combination of these could potentially be used to structure the silicon surface so as to produce these regions that will lock the metal into the silicon in specific strategic locations.

The invention claimed is:

1. A solar cell comprising two semiconductor material layers forming a photovoltaic junction, and a metal contact plated to and electrically connected to a surface of one of the semiconductor material layers, the surface of the one of the semiconductor material layers to which the metal contact is electrically connected being a doped surface and having a localized heavily doped line within the doped surface, the metal contact comprising a metal finger plated to and electrically connected to the localized heavily doped line along the localized heavily doped line, wherein discrete isolated surface keying features are intermittently located along the localized heavily doped line under the metal finger such that the metal finger extends between the discrete isolated surface keying features and into the discrete isolated surface keying features, whereby the discrete isolated surface keying features assist in attachment of the metal finger to the localized heavily doped line at a plurality of locations in a length direction of the localized heavily doped line, wherein the metal finger is in contact with and electrically connected to the localized heavily doped line including at a location between adjacent discrete isolated surface keying features in the length direction of the localized heavily doped line.

2. The solar cell of claim 1 wherein the surface of the one of the semiconductor material layers to which the metal contact is electrically connected is a light receiving front surface of the semiconductor material layers.

3. The solar cell of claim 1 wherein at least one of the surface keying features comprises at least one hole having an undercut region resulting in an overhang under which the metal finger extends.

4. The solar cell of claim 3 wherein an axis of the at least one hole is generally perpendicular to the surface of the one of the semiconductor material layers to which the metal contact is electrically connected and the undercut region forms a ledge around a part of a periphery of an opening of the hole at the surface of the one of the semiconductor material layers to which the metal contact is electrically connected.

5. The solar cell of claim 3 wherein an axis of the at least one hole extends at an angle which is less than 90 degrees to a plane of the surface of the one of the semiconductor material layers to which the metal contact is electrically connected such that the hole undercuts the surface of the one of the semiconductor material layers to which the metal contact is electrically connected.

6. The solar cell of claim 1 wherein the surface keying features comprise a plurality of holes including at least a first hole and a second hole and an axis of each one of the first and second holes extends at an angle which is less than 90 degrees to a plane of the surface of the one of the semiconductor material layers to which the metal contact is electrically connected such that the first and second holes each undercut the surface of the one of the semiconductor material layers to which the metal contact is electrically connected, wherein the axis of the first hole extends in a different direction to the axis of the second hole.

7. The solar cell of claim 2, wherein at least one of the surface keying features comprises at least one hole having an undercut region resulting in an overhang under which the metal finger extends.

8. The solar cell of claim 2, wherein the surface keying features comprise a plurality of holes including at least a first hole and a second hole and an axis of each one of the first and second holes extends at an angle which is less than 90 degrees to a plane of the surface of the one of the semiconductor material layers to which the metal contact is electrically connected such that the first and second holes each undercut the surface of the one of the semiconductor material layers to which the metal contact is electrically connected, wherein the axis of the first hole extends in a different direction to the axis of the second hole.

9. The solar cell of claim 1, wherein the localized heavily doped line is a laser-doped line in the surface of the one of the semiconductor material layers.

10. The solar cell of claim 1, wherein the surface keying features located along the localized heavily doped line are located at least at opposite ends of the localized heavily doped line in the length direction of the localized heavily doped line and where the metal finger terminates.

11. The solar cell of claim 1, wherein the surface keying features are located periodically along the localized heavily doped line in the length direction of the localized heavily doped line.

12. The solar cell of claim 1, wherein the metal finger substantially fills the surface keying features.

* * * * *